US 7,129,678 B2
(12) United States Patent
Cheng
(10) Patent No.: US 7,129,678 B2
(45) Date of Patent: Oct. 31, 2006

(54) HIGH VOLTAGE GENERATOR USING INDUCTOR-BASED CHARGE PUMP FOR AUTOMOTIVE ALTERNATOR VOLTAGE REGULATOR

(75) Inventor: Hsi Chin Cheng, Keelung (TW)

(73) Assignee: Victory Industrial Corporation (TW)

( * ) Notice: Subject to any disclaimer, the term of this patent is extended or adjusted under 35 U.S.C. 154(b) by 284 days.

(21) Appl. No.: 10/328,664

(22) Filed: Dec. 23, 2002

(65) Prior Publication Data

US 2003/0142518 A1    Jul. 31, 2003

Related U.S. Application Data

(60) Provisional application No. 60/351,815, filed on Jan. 25, 2002.

(51) Int. Cl.
*G05F 1/652* (2006.01)
(52) U.S. Cl. .................. 323/222; 323/225; 323/282
(58) Field of Classification Search .......... 322/20, 322/28, 91; 323/222, 224, 225, 282
See application file for complete search history.

(56) References Cited

U.S. PATENT DOCUMENTS

| 4,461,989 | A |   | 7/1984  | Dotson et al. ......... 323/222 |
| 4,636,705 | A |   | 1/1987  | Bowman ................. 322/28 |
| 4,733,159 | A | * | 3/1988  | Edwards et al. ........ 323/282 |
| 5,023,474 | A |   | 6/1991  | Wilcox |
| 5,155,670 | A |   | 10/1992 | Brian .................. 363/24 |
| 5,381,044 | A |   | 1/1995  | Zisa et al. |
| 5,399,913 | A |   | 3/1995  | Widener et al. |
| 5,426,334 | A |   | 6/1995  | Skovmand |
| 5,483,436 | A |   | 1/1996  | Brown et al. |
| 5,627,460 | A |   | 5/1997  | Bazinet et al. |
| 5,723,973 | A | * | 3/1998  | Umeda et al. ......... 322/20 |
| 5,748,428 | A |   | 5/1998  | Kelley et al. |
| 5,825,218 | A |   | 10/1998 | Colli et al. |

(Continued)

FOREIGN PATENT DOCUMENTS

EP    0 973 250 A2    1/2000

OTHER PUBLICATIONS

Warren Schultz, Drive Techniques For High Side N-Channel MOSFETS, AR194, Jun. 1998, Motorola Semiconductor Products Inc. Phoenix, AZ.

(Continued)

*Primary Examiner*—Gary L Laxton
(74) *Attorney, Agent, or Firm*—Fliesler Meyer, LLP

(57) ABSTRACT

A low cost, board level, inductor-based charge pump is provided to generate a sufficiently high voltage to drive a power MOSFET 307 having a rotor coil 311 attached on its source side in an automotive alternator voltage regulator. A first BJT transistor 303 of the charge pump receives a clock signal at its base from an application specific integrated circuit (ASIC) 302. The clock signal continuously turns transistor 303 on and off, forcing a current to flow through an inductor 301 connected to a voltage supply terminal. A second BJT transistor 308 receives a gate control signal at its base from the ASIC 302 for turning the second transistor 308 on and off to enable the circuit. In operation when the first transistor 303 is turned off, a slowly decreasing current flows from the inductor 301 to an output node. With the base of the second transistor 308 low to enable the system, the second transistor 308 is turned off and the current flows from the output node through a capacitor 309 to ground. The current charges the capacitor 309 to a higher voltage level than the alternator system voltage Vcc. The voltage across the capacitor 309 is sufficiently high to drive the power MOSFET 307 in an automotive alternator voltage regulator.

12 Claims, 2 Drawing Sheets

U.S. PATENT DOCUMENTS

| | | | |
|---|---|---|---|
| 5,936,440 A | 8/1999 | Asada et al. | 327/110 |
| 5,939,927 A | 8/1999 | Myers | |
| 5,969,964 A | 10/1999 | Mangtani | 363/132 |
| 5,973,482 A | 10/1999 | Meinert | |
| 6,054,738 A | 4/2000 | Sander et al. | |
| 6,275,018 B1 * | 8/2001 | Telefus et al. | 323/282 |
| 6,424,208 B1 | 7/2002 | Pinai | |
| 6,445,623 B1 | 9/2002 | Zhang et al. | |

OTHER PUBLICATIONS

In-Rush Current Limit MOSFET Driver, Si9750 Vishay Siliconix, VISHAY, S-60752-Rev. C, Apr. 5, 1999, FaxBack 408-970-5600, request 70028, www.siliconix.com.

* cited by examiner

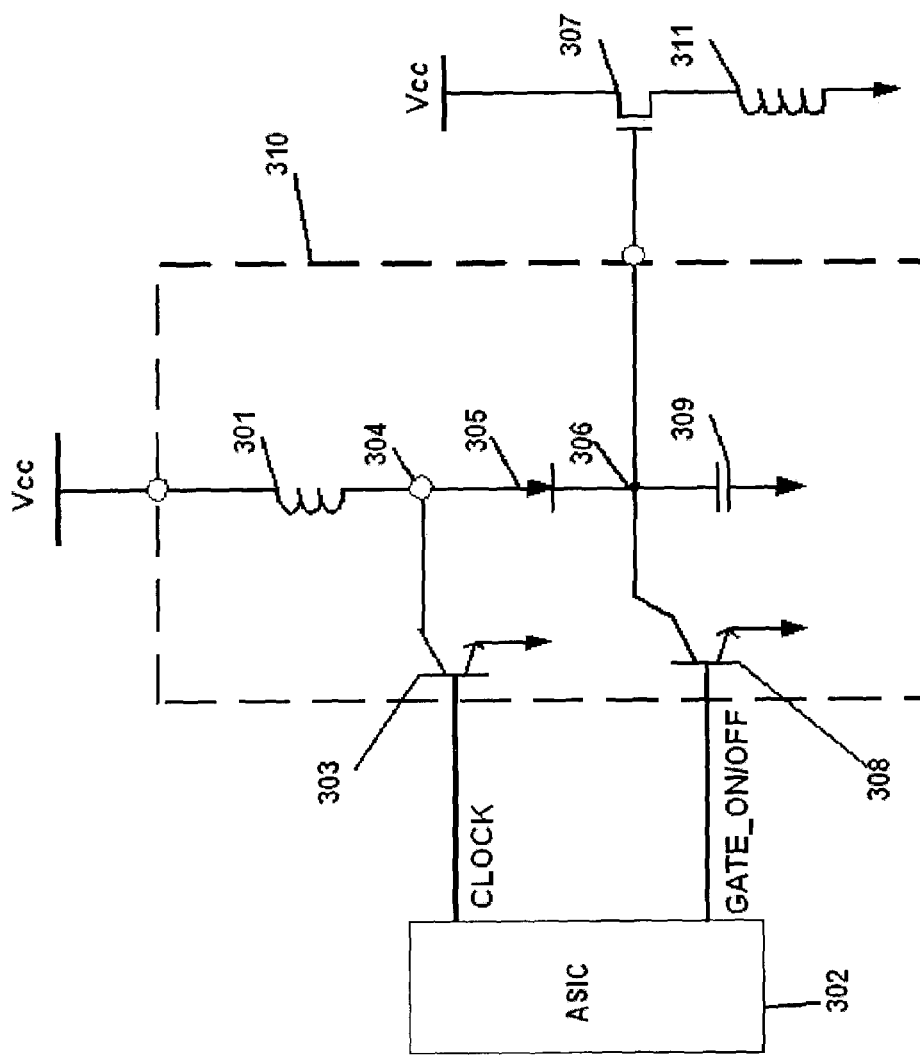

HIGH VOLTAGE GENERATOR USING INDUCTOR-BASED CHARGE PUMP FOR AUTOMOTIVE ALTERNATOR VOLTAGE REGULATOR

CROSS REFERENCE TO PROVISIONAL APPLICATION

This application claims priority to provisional patent application SC/Ser. No.: 60/351,815, filed Jan. 25, 2002.

FIELD OF THE INVENTION

The present invention relates generally to automotive alternators, and to high voltage generators using inductor-based charge pumps for automotive alternator voltage regulators.

BACKGROUND

Automobile charging systems generally include an alternator and a battery. The alternator includes a rotor coil, stator, rectifier bridge, diode trio and voltage regulator.

A magnetic field is produced by passing a current through the rotor coil of the alternator. A voltage is induced in the stator of an alternator by current in the rotor coil when the alternator shaft is rotated by the automobile's engine. The rectifier bridge converts the AC voltage induced in the stator to a DC voltage needed for charging the automobile's battery. A diode trio further converts the AC voltage induced in the stator to a DC voltage for supplying current to the rotor coil. The voltage regulator controls the current in the rotor coil in order to maintain the output voltage of the alternator at a desired constant level.

Automotive alternators can generally divided into two types. In a first type, the alternator rotor coil is attached between the system power supply, or battery, and a power MOSFET connecting the rotor coil to ground. In a second type, the alternator rotor coil is connected between ground and a power MOSFET connecting the rotor coil to the system power supply, or battery.

FIG. 1 shows components of the first type of automotive alternator. In FIG. 1, the source of a power MOSFET 101 is connected directly to ground and the drain is connected to the rotor coil 103 of the automotive alternator. It is reasonably easy to drive this type of automotive alternator. The voltage applied to the gate of MOSFET 101 need only be reasonably higher than its source by a threshold voltage (Vt) for the power MOSFET 101 to turn on in a "low resistance" region of operation. The threshold voltage is the minimum voltage which must be applied between the gate and source of the transistor in order to enable current flow from the drain to the source. A threshold voltage of Vt (~1V) will put the MOSFET 101 in a "low resistance" mode since its source is grounded, as shown in FIG. 1. The system voltage from the application specific integrated circuit (ASIC) 102, $V_{ccASIC}$, is typically around 5V. Thus, standard circuitry as provided in the ASIC 102 can be used to apply the MOSFET 101 gate voltage to cause a "low resistance" operation mode to enable current to flow through the rotor coil 103 of the automotive alternator.

FIG. 2 shows components of the second type of automotive alternator. In FIG. 2, the source of a power MOSFET 201 is connected to the rotor coil 203. The drain of the power MOSFET is connected to the alternator system voltage Vcc. This type of automotive alternator is more difficult to drive than the first type of automotive alternator shown in FIG. 1.

As with FIG. 1, the power MOSFET transitor 203 of FIG. 2 also has a minimum threshold voltage which must be applied to its gate in order to place the transistor into the "low resistance" region of operation. In order to turn on a power MOSFET 203 with a load connected on the source side, a gate voltage higher than the drain potential must be applied.

Since a potential exists across the rotor coil 203 of the alternator system voltage Vcc in FIG. 2, the voltage applied to the gate of the power MOSFET 201 must be higher than the system voltage in order to put the power MOSFET into the "low resistance" region of operation. The alternator system voltage Vcc ranges up to 14.4V. The alternator voltage Vcc is typically the battery voltage of 12V, or 14.4 when the alternator is running. To put the MOSFET 201 into a "low resistance" mode, the gate voltage applied to MOSFET 101 must be higher than both the source and drain voltages by a threshold voltage Vt (~1V). With a Vt needed to put the MOSFET 201 in a "low resistance" region the gate voltage applied to the MOSFET 201 will then typically be at least 15.4V.

Typically, the electronics used to drive a MOSFET gate are embedded in an ASIC 202. Since a higher voltage than the alternator system voltage of 15.4V is needed to drive the gate of the power MOSFET 203, the ASIC will require a charge pump circuit for generating the necessary voltage. Since the ASIC system voltage $V_{ccASIC}$ is around 5V, the ASIC outputs cannot be connected to the gate of the MOSFET 201 directly unless a charge pump is included to supply the increased voltage. Charge pump circuits within the ASIC will significantly increase the cost of the ASIC 202.

SUMMARY

An automotive alternator voltage regulator according to the present invention addresses the shortcomings of the prior art. In accordance with the present invention, a low cost, board level, inductor-based charge pump supplies a high voltage to drive the gate of a power MOSFET of an automotive alternator. The inductor-based charge pump is not placed within an ASIC, thereby eliminating the need for a more expensive ASIC with an integrated charge pump circuit.

The automotive alternator voltage regulator in accordance with the present invention, referring to FIG. 3, includes an alternator rotor coil 311 having a first terminal connected to ground and a second terminal connected to the source of a power MOSFET 307. The drain of the power MOSFET 307 is connected to a power supply terminal and the gate is connected at a first node 306 to a power MOSFET driver circuit 310. A first bi-polar junction (BJT) transistor 303 in the driver circuit 310 has a collector-emitter current path connecting a second node 304 to ground. A second BJT transistor 308 has a collector-emitter current path connecting the first node 306 ground. An inductor 301 connects a power supply terminal Vcc to the second node 304. A diode 305 connects the second node 304 to the first node 306. A capacitor 309 connects the first node 306 to ground. The ASIC 302 is configured to provide a clock signal to the base of the first BJT transistor 303 and to provide a gate control signal to the base of the second BJT transistor 308.

In operation, by appropriately applying the clock signal (CLOCK) to the BJT transistor 303, current is generated to charge the capacitor 309 to a higher voltage level than the alternator system voltage Vcc. An enable/disable control signal (GATE_ON/OFF) is applied to the base of BJT transistor 308 to selectively disable or enable the charge pump circuit 310 as desired. With BJT transistor 308 set to enable the circuit, the voltage across the capacitor 309 is charged sufficiently high to drive the power MOSFET 307 to enable it to function at a desired level in an automotive alternator voltage regulator.

BRIEF DESCRIPTION OF THE DRAWINGS

Details in accordance with the present invention are described with reference to the drawings, in which:

FIG. 3 shows components of an automotive alternator in accordance with the present invention.

DETAILED DESCRIPTION

Figure 1:
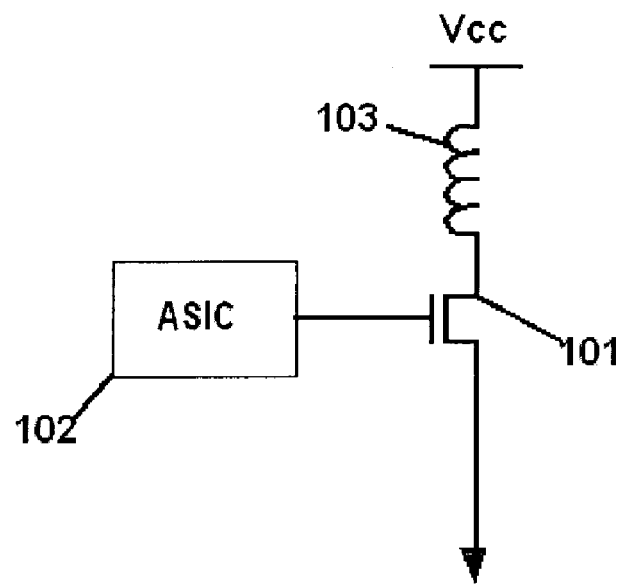
FIG. 1 shows components of a first prior art automotive alternator.
Figure 2:
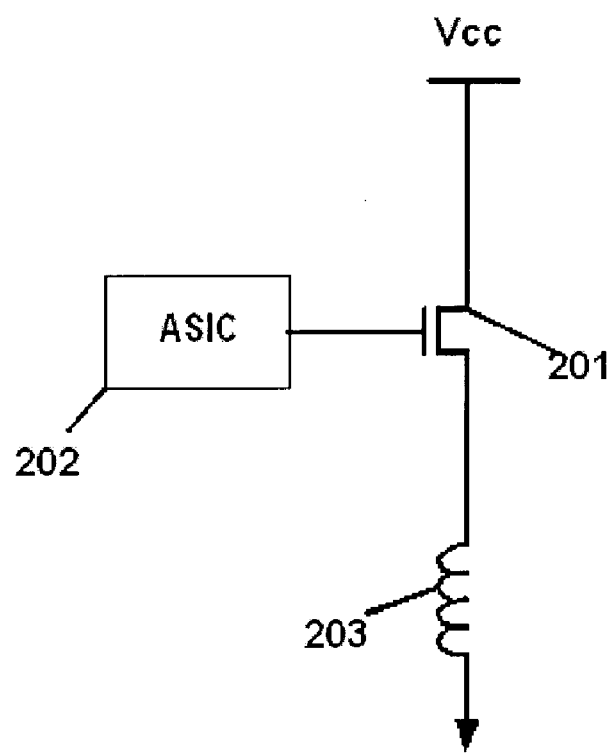
FIG. 2 shows components of a second prior art automotive alternator.

With the components of FIG. 3 in operation, the ASIC 302 provides a clock signal (CLOCK) to the base of a first transistor 303. The duty cycle of the clock signal CLOCK is not of absolute importance. The clock signal CLOCK continuously switches the first transistor 303 on and off, forcing a current to flow through inductor 301. When the first transistor 303 is turned on, the current flow is from source Vcc through inductor 301 to node 304, and thence through the first transistor 303 to ground.

When the first transistor 303 is turned off, the current in inductor 301 cannot change immediately. Thus, some slowly decreasing current will flow from the power supply Vcc through inductor 301 to node 304, and thence through diode 305 to output node 306. Current will only flow through the diode in this direction while it is forward biased. Diode 305 remains forward biased so long as the voltage at node 304 remains higher than the voltage at output node 306.

The current flow from output node 306 is controlled by a base control signal (GATE_ON/OFF) provided by the ASIC 302 to the base of transistor 308. When the base control signal is high the GATE_ON/OFF signal is indicating the gate of MOSFET transistor 307 should turn off transistor 307, so a voltage is applied to transistor 308 to turn it on so that current flows from node 306 through the second transistor 308 to ground. When the GATE_ON/OFF signal is low indicating the transistor 307 should be active, a voltage is applied to turn off the second transistor 308 so that current only flows through the capacitor 309 to ground. The transistor 308 in combination with the GATE_ON/OFF signal function to provide a system enable or disable control.

With transistor 308 turned off to enable the system, the current flowing through capacitor 309 will charge the capacitor 309 to a higher voltage than the alternator system voltage Vcc. The voltage stored by the capacitor 309 is high enough to drive the gate of power MOSFET 307 and place the power MOSFET 307 into the "low resistance" region of operation. As indicated previously, the gate voltage applied to the MOSFET 307 to create the "low resistance" region of operation is approximately 15.4. Thus, a current flow from the drain to the source of the power MOSFET 307 is enabled. The resistors needed for operation of FIG. 3 are omitted for simplicity of explanation. The proper placement of resistors in FIG. 3 will be within the knowledge of one skilled in the art.

The ASIC 302 can be provided as the single integrated circuit illustrated, or as a separate circuits, a first providing the clock signal (CLOCK) to the base of transistor 303, and a second providing the enable signal (GATE_ON/OFF) to the base of transistor 308. Similarly, although transistors 303 and 308 are shown as NPN BJT devices, PNP BJT transistors could be used. Similarly, although transistors 303 and 308 are shown as BJT devices, CMOS transistors could be used instead. Likewise, the power MOSFET 307 could be replaced with a power BJT transistor with proper resistors used for biasing.

Although the present invention has been described above with particularity, this was merely to teach one of ordinary skill in the art how to make and use the invention. Additional modifications will fall within the scope of the invention, as that scope is defined by the following claims.

What is claimed is:

1. An automotive alternator voltage regulator comprising:
    an alternator rotor coil having a first terminal connected to ground and a second terminal;
    a power MOSFET having a source connected to the second terminal of the alternator rotor coil, a drain connected to a power supply terminal, and a gate forming a first node;
    a first BJT transistor having a collector-emitter path connecting a second node to ground, and having a base;
    a second BJT transistor having a collector-emitter path connecting the first node to ground, and having a base;
    an inductor connecting the power supply terminal to the second node;
    a diode connecting the first node to the second node;
    a capacitor connecting the first node to ground;
    an application specific integrated circuit (ASIC) configured to provide a clock signal to the gate of the first transistor, and to provide a base control signal to the base of the second transistor to selectively turn on and off the second transistor.

2. The automotive alternator voltage regulator of claim 1, wherein the clock signal continuously turns on and off the first transistor.

3. The automotive alternator voltage regulator of claim 2, wherein a low base control signal turns off the second transistor to enable the alternator voltage regulator and force a current through the capacitor to charge the capacitor to a voltage higher than an alternator system voltage on the power supply terminal.

4. The automotive alternator voltage regulator of claim 3, wherein the charged capacitor drives the gate of the power MOSFET, placing it into the low resistance region of operation.

5. An automotive alternator voltage regulator comprising:
    an alternator rotor coil having a first terminal connected to a first voltage potential connection and a second terminal;
    a power transistor having a current path with a first terminal connected to the second terminal of the alternator rotor coil, a second terminal connected to a second voltage potential connection, and a third terminal for controlling current in the current path forming a first node;
    a first control transistor having a current path connecting a second node to the first voltage potential connection, and having a control terminal;
    an inductor connecting a power supply terminal to the second node;
    a diode connecting the first node to the second node;
    a capacitor connecting the first node to ground;
    a clock circuit providing a clock signal to the control terminal of the first transistor; and
    a second control transistor having a current path connecting the second node to the first voltage potential connection, and having a control terminal configured for receiving an enable control signal.

6. The automotive alternator voltage regulator of claim 5, wherein the power transistor is a MOSFET and the first and second control transistors are BJT transistors.

7. A charge pump circuit for an automotive alternator voltage regulator comprising:
   a first transistor having a current path connecting a first node to ground, and having a current control terminal;
   an inductor connecting a power supply terminal to the first node;
   a diode connecting the first node to a charge pump output;
   a capacitor connecting the charge pump output to ground;
   a clock signal generation circuit configured to provide a clock signal to the control terminal of the first transistor; and
   a second transistor having a current path connecting the charge pump output to ground, and having a control terminal configured for receiving a system enable signal.

8. The charge pump circuit of claim 7, wherein a low voltage system enable signal turns off the second transistor and forces a current to flow through the capacitor.

9. The charge pump circuit of claim 8, wherein the current charges the capacitor to a voltage higher than an alternator system voltage.

10. The automotive alternator voltage regulator of claim 9, wherein the power transistor is a MOSFET and the first and second control transistors are BJT transistors.

11. The automotive alternator voltage regulator of claim 10, wherein the clock signal and the enable control signal are provided from a single integrated circuit.

12. A method for generating a voltage to drive a power transistor of an automotive alternator voltage regulator comprising:
   receiving a system power supply voltage at a first terminal of an inductor;
   generating a clock signal;
   applying the clock signal to a first transistor connecting a second terminal of the inductor to a first potential to control current flow through the inductor;
   charging a capacitor to a voltage greater than the system power supply voltage by forcing a decreasing current from the inductor to a capacitor providing an output to the power transistor so that current flows to the capacitor from the second terminal of the inductor when a voltage on the second terminal of the inductor is greater than a voltage on the capacitor;
   providing an enable/disable signal to a second transistor connected to the capacitor to prevent charging of the capacitor in a disable of the enable/disable signal.

* * * * *